United States Patent
Takahashi et al.

(10) Patent No.: US 7,718,981 B2
(45) Date of Patent: May 18, 2010

(54) COMPOSITE CHARGED-PARTICLE BEAM SYSTEM

(75) Inventors: Haruo Takahashi, Chiba (JP); Yo Yamamoto, Chiba (JP); Toshiaki Fujii, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 155 days.

(21) Appl. No.: 12/134,919

(22) Filed: Jun. 6, 2008

(65) Prior Publication Data

US 2008/0315088 A1    Dec. 25, 2008

Related U.S. Application Data

(63) Continuation of application No. PCT/JP2006/323750, filed on Nov. 29, 2006.

(30) Foreign Application Priority Data

Dec. 9, 2005    (JP) .............................. 2005-355734

(51) Int. Cl.
*G01N 23/00* (2006.01)

(52) U.S. Cl. .................. 250/492.21; 250/307; 250/310; 250/311; 250/442.11; 250/492.1

(58) Field of Classification Search .................. 250/307, 250/310, 311, 442.11, 492.21
See application file for complete search history.

(56) References Cited

U.S. PATENT DOCUMENTS 5,329,125 A * 7/1994 Feuerbaum ............ 250/442.11
6,420,722 B2 * 7/2002 Moore et al. ............ 250/559.27
6,444,991 B1 * 9/2002 Yamada et al. ......... 250/442.11

(Continued)

FOREIGN PATENT DOCUMENTS

JP    10-221227 A    8/1998

(Continued)

OTHER PUBLICATIONS

Fujii, "FIB Apparatus Capable of Suppressing Damage upon Preparation of Samples (SMI3000SE-series)", Electronic Materials and Parts, pp. 36-38 (Jun. 2004).

(Continued)

*Primary Examiner*—David A Vanore
(74) *Attorney, Agent, or Firm*—Brinks Hofer Gilson & Lione

(57) ABSTRACT

There is provided a method of arranging, as a composite charged-particle beam system, a gas ion beam apparatus, an FIB and an SEM in order to efficiently prepare a TEM sample. The composite charged-particle beam system includes an FIB lens-barrel 1, an SEM lens-barrel 2, a gas ion beam lens-barrel 3, and a rotary sample stage 9 having an eucentric tilt mechanism and a rotating shaft 10 orthogonal to an eucentric tilt axis 8. In the composite charged-particle beam system, an arrangement is made such that a focused ion beam 4, an electron beam 5 and a gas ion beam 6 intersect at a single point, an axis of the FIB lens-barrel 1 and an axis of the SEM lens barrel 2 are orthogonal to the eucentric tilt axis 8, respectively, and the axis of the FIB lens-barrel 1, an axis of the gas ion beam lens-barrel 3 and the eucentric tilt axis 8 are in one plane.

1 Claim, 2 Drawing Sheets

U.S. PATENT DOCUMENTS

| | | | |
|---|---|---|---|
| 6,661,009 B1* | 12/2003 | Groholski et al. | 850/9 |
| 6,664,552 B2* | 12/2003 | Shichi et al. | 250/492.21 |
| 6,717,156 B2* | 4/2004 | Sugaya et al. | 250/440.11 |
| 7,015,483 B2* | 3/2006 | Suzuki et al. | 250/311 |
| 7,268,356 B2* | 9/2007 | Shichi et al. | 250/492.21 |
| 2003/0222221 A1* | 12/2003 | Groholskiy et al. | 250/442.11 |
| 2004/0158409 A1* | 8/2004 | Teshima et al. | 702/22 |
| 2004/0251413 A1 | 12/2004 | Suzuki et al. | |
| 2006/0157341 A1 | 7/2006 | Fujii | |
| 2006/0226376 A1* | 10/2006 | Fujii | 250/492.21 |
| 2008/0250881 A1* | 10/2008 | Dona | 73/864.91 |
| 2009/0230303 A1* | 9/2009 | Teshima et al. | 250/310 |

FOREIGN PATENT DOCUMENTS

| | | |
|---|---|---|
| JP | 3041403 B | 3/2000 |
| JP | 2005-302600 A | 10/2005 |

OTHER PUBLICATIONS

International Search Report issued Feb. 20, 2007 in International application No. PCT/JP2006/323750.

Written Opinion of the International Search Authority issued Feb. 20, 2007 in International application No. PCT/JP2006/323750.

International Preliminary Report issued Jun. 11, 2008 in International application No. PCT/JP2006/323750.

* cited by examiner

US 7,718,981 B2

COMPOSITE CHARGED-PARTICLE BEAM SYSTEM

This application is a continuation of PCT/JP2006/323750 filed Nov. 29, 2006, which claims priority to JP2005-355734 filed Dec. 9, 2005, the entire content of which is incorporated herein by reference.

TECHNICAL FIELD

The present invention relates to a composite charged-particle beam system having a plurality of charged-particle beam apparatuses coupled to one another.

BACKGROUND ART

As a pattern of a semiconductor device becomes finer, recently, a technique of observing and evaluating a speck minute portion of the semiconductor device with the use of a TEM (Transmission Electron Microscope) has increasingly become important. In order to prepare a laminated sample serving as such a specific minute portion, an FIB (Focused Ion Beam) apparatus is used typically. However, the FIB causes a problem of damage due to a focused ion beam as a required thickness of a sample becomes small. Therefore, a method for removing such damage has been required.

As a solution of the situation described above, for example, there has been proposed a method for irradiating an ion beam containing, as an ionic species, a chemical element which is low in chemical activity, such as argon, at a low acceleration voltage of not more than several kilovolts (refer to Patent Document 1).

In order to accurately prepare a TEM sample containing a specific minute portion of a semiconductor, on the other hand, there has also been proposed a system having an FIB and an SEM (Scanning Electron Microscope) coupled to each other, as disclosed in Patent Document 2, for example. In this system, a laminated sample to be prepared is subjected to a micromachining process with the use of the FIB while being carefully observed with the use of the SEM such that the sample includes a specific site to be observed.

Moreover, there has also been proposed a system using combined three beams from an FIB, an SEM and a gas ion beam in order to achieve the merits described above (Non-Patent Document 1). In the composite charged-particle beam system having the three charged-particle beam apparatuses integrated with one another, an arrangement of the respective charged particle beam apparatuses and a relation between the arrangement of the respective charged-particle beam apparatuses and a degree of freedom of a sample stage becomes a very important factor in order to design such a system that a user can conduct work efficiently while making use of characteristics of the respective charged-particle beam apparatuses. In the following, the reasons therefor are described.

Firstly, an FIB apparatus, an SEM and a gas ion beam apparatus are typically required to be arranged near a sample in order to advantageously converge beams from those apparatuses. However, as beam apparatuses to be integrated with one another increase in number, it is difficult to arrange all the beam apparatuses under preferable conditions. Secondly, a sample such as a semiconductor wafer is subjected to observation and fabrication while being tilted; therefore, a space for tilting the sample must be ensured in a sample chamber, resulting in further restriction of a space in which charged-particle beam apparatuses can be arranged freely. Thirdly, with regard to a sample stage, it is difficult to sufficiently improve a degree of freedom of the stage for all charged-particle beams from the viewpoint of space, accuracy, rigidity and cost. Consequently, usability of a composite charged-particle beam system largely depends on a relation between the degree of freedom of the stage and the arrangement of the charged-particle beam apparatuses.

As described above, the arrangement of the respective charged-particle beam apparatuses and the relation between the arrangement of the respective charged-particle beam apparatuses and the degree of freedom of the sample stage becomes a very important factor in order to design such a system that the user can conduct the work efficiently while making use of the characteristics of the respective charged-particle beam apparatuses. However, no mention has been made of this fact in the conventional disclosure.

Patent Document 1: Japanese Unexamined Patent Publication No. 10-221227
Patent Document 2: Japanese Patent No. 3,041,403
Non-Patent Document 1: Toshiaki Fujii, "FIB Apparatus Capable of Suppressing Damage upon Preparation of Samples" (SM13000-series), Electronic Materials and Parts, (June, 2004), pp. 36-38.

SUMMARY OF THE INVENTION

In view of the circumstances described above, an object of the present invention is to provide a method of configuring a composite charged-particle beam system capable of efficiently preparing a TEM sample without impairing an advantage of suppressing damage due to irradiation of an inert gas ion such as argon at a low acceleration, a technique of preparing a sample with high accuracy with the use of a high-performance FIB, and a function of observing an endpoint of a laminating process with the use of a high-performance SEM for forming a laminated specific portion of a semiconductor fine pattern.

In order to achieve this object, according to a first aspect of the present invention, a composite charged-particle beam system includes at least a focused ion beam apparatus, a scanning electron microscope, a gas ion beam apparatus and a sample stage. Herein, the sample stage includes an eucentric tilt mechanism for tilting at least a sample at an identical height, and a rotating shaft orthogonal to an eucentric tilt axis serving as an axis of the eucentric tilt mechanism. The focused ion beam apparatus, the scanning electron microscope and the gas ion beam apparatus are arranged and adjusted such that a focused ion beam emitted from the focused ion beam apparatus, an electron beam emitted from the scanning electron microscope and a gas ion beam emitted from the gas ion beam apparatus intersect at an area defined as a single point, and are arranged such that an axis of a lens-barrel of the focused ion beam apparatus and an axis of a lens-barrel of the electron microscope are substantially orthogonal to the eucentric tilt axis, respectively, and the axis of the lens-barrel of the focused ion beam, an axis of a lens-barrel of the gas ion beam and the eucentric tilt axis are in one plane.

In action according to the first aspect of the present invention for achieving the object described above, the arrangement and adjustment are made such that the focused ion beam, the electron beam and the gas ion beam intersect at the area defined as a single point, so that the focused ion beam, the electron beam and the gas ion beam can be irradiated onto a single point on the sample. In addition, the arrangement is made such that the axis of the focused ion beam lens-barrel and the axis of the electron beam lens-barrel are substantially orthogonal to the eucentric tilt axis, respectively, and the axis of the focused ion beam lens-barrel, the axis of the gas ion beam lens-barrel and the eucentric tilt axis are practically in one plane. Thus, when the sample is tilted at an appropriate angle relative to a fabricated face subjected to processes with the use of the focused ion beam in a direction parallel with the plane, the gas ion beam can be irradiated on the fabricated face at a narrow angle. Further, the scanning electron microscope can attain a wide angle sufficient to observe the surface of the sample during the fabrication.

According to the present invention, the FIB apparatus performs the laminating process for preparing a laminated sample such that a surface of the sample faces the SEM, so that a user can observe the surface with the use of the SEM during the process without moving the stage. After completion of the laminating process in this state, the axis of the gas ion beam is parallel with the surface of the laminated sample. In order to prepare the sample with less damage, desirably, the gas ion beam is irradiated on the sample surface at a small angle. Herein, the gas ion beam is irradiated at the time when the laminating process using the FIB is completed. Therefore, the sample can be subjected to a finishing process using the gas ion beam by being tilted only at an appropriate angle. Herein, when the gas ion beam is irradiated on the surface of the laminated sample at a narrow angle, the surface of the laminated sample can hold a relatively wide angle relative to the SEM. Therefore, the user can observe the sample without changing the state. Also in a case where the user must observe the sample which correctly faces the SEM, the sample can be moved to an observation position with little stage movement. According to the present invention, as described above, it is possible to configure a composite charged-particle beam system capable of efficiently preparing a TEM sample without impairing an advantage of suppressing damage due to irradiation of a gas ion at a low acceleration, a technique of preparing a sample with high accuracy with the use of a high-performance FIB, and a function of observing an endpoint of a laminating process with the use of a high-performance SEM for forming a laminated specific portion of a semiconductor fine pattern.

PREFERRED EMBODIMENTS

With reference to the drawings, hereinafter, description will be given of the preferred embodiments for carrying out the present invention. It is to be noted herein that the description of the following embodiments is merely exemplification; therefore, the configuration of the present invention is not limited to the description.

First Embodiment

Figure 1:
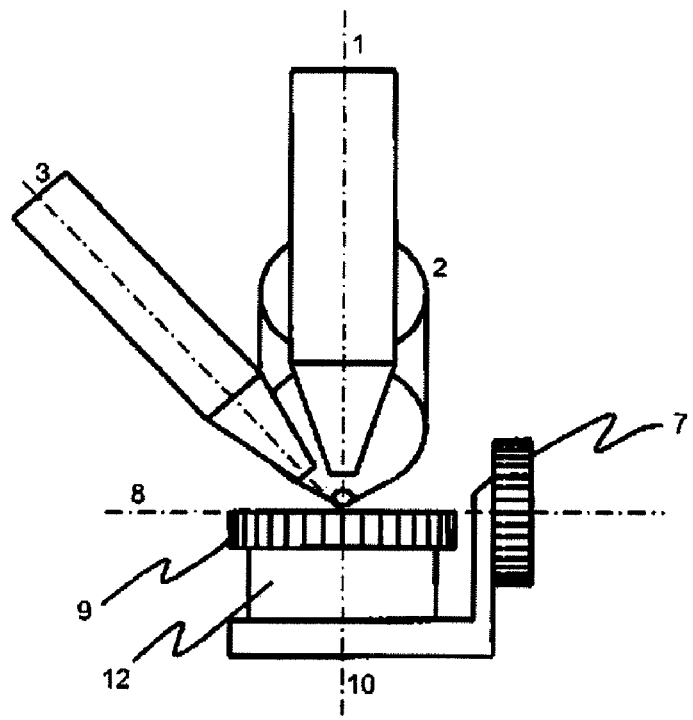
FIG. 1 schematically shows a composite charged-particle beam system according to a first embodiment of the present invention.

FIG. 1 schematically shows a composite charged-particle beam system according to a first embodiment of the present invention. In the present invention, a type of an ion to be used as a gas ion beam 6 is not an essential matter. In this embodiment, however, an argon ion beam is used as the gas ion beam 6.

As shown in FIG. 1, an FIB lens-barrel 1, an SEM lens-barrel 2 and a gas ion beam lens-barrel 3 are designed such that axes thereof intersect at a single point, and respectively have a mechanism for making adjustment such that actual beams therefrom also intersect at one intersection point. In the following, a coordinate system with the beam intersection point as an origin is used for representing a relation among the FIB lens-barrel 1, the SEM lens-barrel 2, the gas ion beam lens-barrel 3, an eucentric tilt axis 8 and a rotating shaft 10. Orientation of each axis is represented by an angle from a horizontal plane (hereinafter, referred to as an elevation angle) and an angular relation on the horizontal plane at the time when the axis is projected on the horizontal plane (hereinafter, referred to as an azimuth angle).

In this embodiment, the FIB lens-barrel 1 is attached in a vertical direction relative to the horizontal plane, and the SEM lens-barrel 2 and the gas ion beam lens-barrel 3 are arranged such that a difference between the respective azimuth angles is 90 degrees. In this case, the elevation angle of each of the SEM lens-barrel 2 and the gas ion beam lens-barrel 3 is not intended for specifying the present invention. For example, the elevation angle of the SEM lens-barrel 2 is 35 degrees, and the elevation angle of the gas ion beam apparatus 3 is 45 degrees.

A sample stage includes an orthogonal three-axis stage 12 and a rotary stage 9. Herein, the rotary stage 9 is disposed on a tilt mechanism through the orthogonal three-axis stage 12. The tilt mechanism includes a rotational action portion 7 and a sample stage base that moves by rotation of the rotational action portion 7. With this configuration, the positional relation among the axis 8 of the tilt mechanism, the FIB lens-barrel 1, the SEM lens-barrel 2 and the gas ion beam apparatus 3 is invariant irrespective of the operation of the stage; therefore, the axis itself of the tilt mechanism serves as the eucentric tilt axis 8. In the composite charged-particle beam system in which the plurality of beams intersect at a single point, the sample can readily be placed on the intersection point of these beams in such a manner that the beam intersection point is set at a point on the eucentric tilt axis 8. The rotating shaft 10 of the rotary stage 9 is not necessarily aligned with the axis of the FIB lens-barrel 1 arranged vertically, by the operation of the orthogonal three-axis stage 12, but can rotate on the axis of the FIB lens-barrel 1 in a pseudo manner by the operation of the orthogonal three-axis stage 12. However, this matter has no bearing on the essence of the present invention. For the sake of brief description, hereinafter, it is assumed that the rotating shaft 10 is aligned with the axis of the FIB lens-barrel 1 and the sample is placed on the rotating shaft. The eucentric tilt axis 8 of the sample stage 9 is made equal in azimuth angle to the axis of the gas ion beam apparatus 3. In other words, the axis of the gas ion beam apparatus 3, which is projected on the horizontal plane, is aligned with the eucentric tilt shaft 8.

Figure 2:
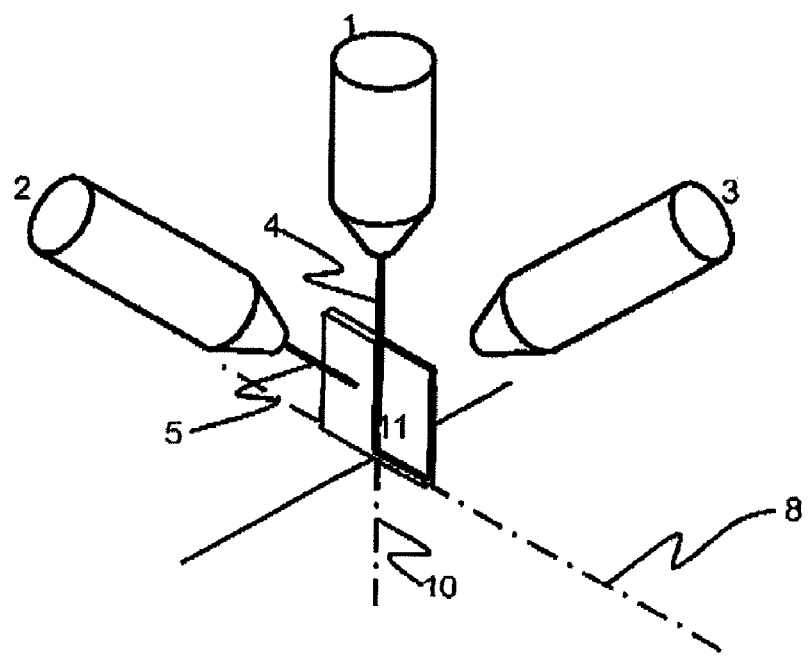
FIG. 2 schematically shows a positional relation between a sample and a charged-particle beam in the composite charged-particle beam system according to the first embodiment of the present invention.
Figure 3:
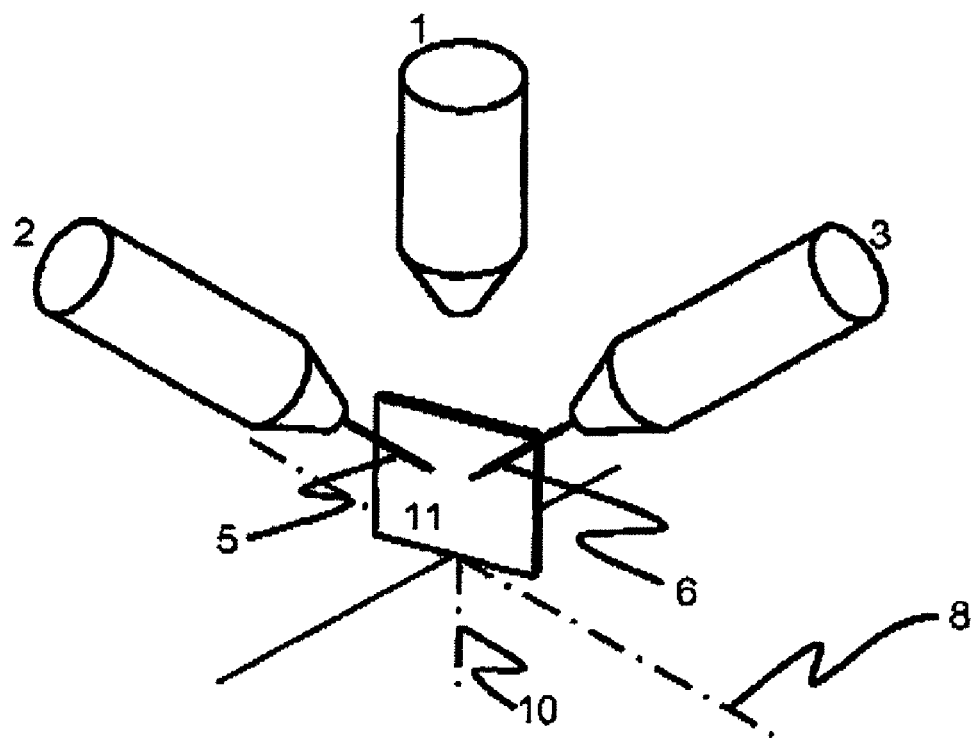
FIG. 3 schematically shows a positional relation between a sample and a charged-particle beam in the composite charged-particle beam system according to the first embodiment of the present invention.

FIG. 2 schematically shows a state that a laminated sample 11 is prepared with the use of the FIB 4 from the FIB leans-barrel 1. As shown in FIG. 2, when the laminated sample is placed such that a surface thereof faces a front side of the SEM lens-barrel 2, the electron beam 5 from the SEM lens-barrel is irradiated on the laminated sample 11 at a wide angle; therefore, a user can observe progress of a laminating process in detail. After completion of the laminating process using the FIB 4, the sample is rotated, and then is subjected to a finishing process in such a manner that the gas ion beam 6 from the gas ion beam lens-barrel 3 is irradiated. In the finishing process using the gas ion beam, typically, when the gas ion beam is irradiated on the surface of the sample at a narrow angle of incidence, the resultant sample can be finished with good status. As the angle of incidence becomes narrower, it takes a time required for finishing the surface of the sample. For this reason, the angle of incidence is determined on the basis of a relation between a time for preparation of the sample and quality to be required. In many cases, the angle of incidence to be used herein is in a range from 10 to 20 degrees. After completion of the finishing process using the FIB 4, the angle of incidence of the gas ion beam 6 is 0 degree. As shown in FIG. 3, therefore, the laminated sample 11 is rotated in order to obtain a desired angle of incidence. The angle of incidence of the gas ion beam 6 onto the laminated sample 11 is narrow as described above. Therefore, an angle of incidence of the electron beam 5 onto the laminated sample 11 is not decreased so much in comparison with the state shown in FIG. 2, so that the user can observe the progress of the finishing process performed on the laminated sample 11 with the use of the gas ion beam 6, without moving the sample stage. In a case of a sample in which a specific minute portion must be observed, such as a semiconductor device, frequently, the user gradually performs the finishing process while examining the progress. Therefore, the observation using the SEM lens-barrel 2 is a very important Step. This step can be performed repeatedly without moving the sample stage, which leads to significant improvement of working efficiency upon preparation of a TEM sample.

Other Embodiment

In the first embodiment described above, the FIB lens-barrel 1 is arranged vertically relative to the horizontal plane; however, the present invention is not particularly limited thereto. For example, an arrangement that a plane including the axis of the FIB lens-barrel 1 and the axis of the gas ion beam lens-barrel 3 is tilted at an appropriate angle about the tilt axis 8 with the SEM lens-barrel 2 being arranged vertically also satisfies features in claim 1. For the similar reason, moreover, one of the FIB lens-barrel 1 and the SEM lens-barrel 2 may not be arranged vertically.

In the first embodiment, moreover, the angle of incidence of the gas ion beam 6 is determined by rotation of the rotary stage 9. Similarly, the angle of incidence of the gas ion beam 6 can also be determined by actuation of the eucentric tilt mechanism. In this case, if the angle of incidence is small, the angle of the electron beam 5 relative to the surface of the laminated sample 11 is not decreased largely; therefore, the user can observe the progress of the finishing process without changing the state.

The present invention makes it possible to configure a composite charged-particle beam system capable of efficiently preparing a TEM sample without impairing an advantage of suppressing damage due to irradiation of a gas ion at low acceleration, a technique of preparing a sample with high accuracy with the use of a high-performance FIB, and a function of observing an endpoint of a laminating process with the use of a high-performance SEM for forming a laminated speck portion of a semiconductor fine pattern.

The invention claimed is:

1. A. composite charged-particle beam system comprising at least a focused ion beam apparatus, a scanning electron microscope, a gas ion beam apparatus and a sample stage, wherein said sample stage includes an eucentric tilt mechanism for tilting at least a sample at an identical height, and a sample stage rotating shaft orthogonal to an eucentric tilt axis serving as an axis of said eucentric tilt mechanism, and said focused ion beam apparatus, said scanning electron microscope and said gas ion beam apparatus are arranged and adjusted such that a focused ion beam emitted from said focused ion beam apparatus, an electron beam emitted from said scanning electron microscope and a gas ion beam emitted from said gas ion beam apparatus intersect at an area defined as a single point, and are arranged such that an axis of a lens-barrel of said focused ion beam apparatus and an axis of a lens-barrel of said electron microscope are substantially orthogonal to said eucentric tilt axis, respectively, and the axis of the lens-barrel of said focused ion beam, an axis of a lens-barrel of said gas ion beam and said eucentric tilt axis are in one plane.

* * * * *